US011459660B2

(12) United States Patent
Endler et al.

(10) Patent No.: US 11,459,660 B2
(45) Date of Patent: Oct. 4, 2022

(54) ARTICLES CONSISTING OF METAL, HARD METAL, CERMET OR CERAMIC AND COATED WITH A HARD MATERIAL, AND METHOD FOR PRODUCING SUCH ARTICLES

(71) Applicant: FRAUNHOFER-GESELLSCHAFT ZUR FOERDERUNG DER ANGEWANDTEN FORSCHUNG E.V., Munich (DE)

(72) Inventors: Ingolf Endler, Coswig (DE); Mandy Hoehn, Dresden (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 16/484,751

(22) PCT Filed: Feb. 2, 2018

(86) PCT No.: PCT/EP2018/052635
§ 371 (c)(1),
(2) Date: Nov. 26, 2019

(87) PCT Pub. No.: WO2018/146013
PCT Pub. Date: Aug. 16, 2018

(65) Prior Publication Data
US 2020/0232100 A1 Jul. 23, 2020

(30) Foreign Application Priority Data
Feb. 10, 2017 (DE) ...................... 10 2017 102 642.8

(51) Int. Cl.
C23C 16/36 (2006.01)
C23C 28/04 (2006.01)

(52) U.S. Cl.
CPC ............ *C23C 28/042* (2013.01); *C23C 16/36* (2013.01); *C23C 28/044* (2013.01); *C23C 28/048* (2013.01)

(58) Field of Classification Search
CPC ... C23C 28/042; C23C 28/044; C23C 28/048; C23C 16/36; C23C 16/30
See application file for complete search history.

(56) References Cited

U.S. PATENT DOCUMENTS

2009/0061156 A1* 3/2009 Ulrich ................ C23C 14/0676
428/141
2014/0370309 A1 12/2014 Endler et al.

FOREIGN PATENT DOCUMENTS

DE 10 2006 019866 10/2007
DE 10 2011 087 715 7/2013
(Continued)

OTHER PUBLICATIONS

D-H Kuo et al., "A new class of Ti—Si—C—N coatings obtained by chemical vapor deposition—part II: low-temperature process", Thin Solid Film, vol. 394, No. 1-2, XP004300437, Elsevier, Amsterdam, ISSN: 0040-6090, DOI: 10.1016/S0040-6090(01)00878-1, Aug. 14, 2001, pp. 80-89.

(Continued)

Primary Examiner — Daniel J. Schleis
Assistant Examiner — Kevin Ct Li
(74) Attorney, Agent, or Firm — Greenblum & Bernstein, P.L.C.

(57) ABSTRACT

Articles containing metal, hard metal, cermet or ceramic and coated with a hard material, and a method for producing same. The hard material layers can be used as anti-wear layers for cutting tools, as protective layers for turbine blades, or as diffusion barriers in microelectronics. The hard material layers exhibit a high hardness, high oxidation resistance, and excellent wear resistance. The articles are (Continued)

Figure 1:
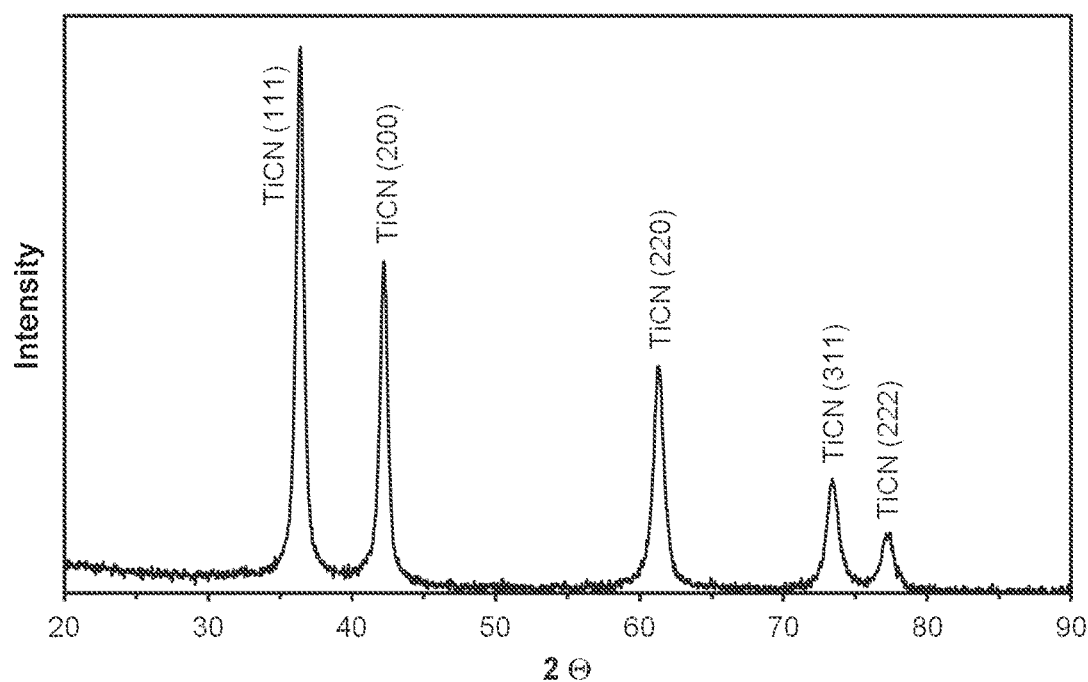

coated with a single- or multi-layer layer system by a thermal CVD method without plasma excitation, where the single- or multi-layer layer system includes at least one nanocomposite layer with a first nanocrystalline phase of cubic titanium oxycarbonitride and a second, amorphous phase of silicon oxycarbonitride or silicon oxycarbide.

15 Claims, 3 Drawing Sheets

(56) References Cited

FOREIGN PATENT DOCUMENTS

| EP | 1 382 709 | 12/2012 | |
|----|-----------|---------|---|
| JP | 2004-074361 | 3/2004 | |
| JP | 2004-114219 | 4/2004 | |
| WO | 2008/129528 | 10/2008 | |
| WO | 2013/083447 | 6/2013 | |
| WO | WO-2013083447 A1 * | 6/2013 | ......... C04B 41/5062 |

OTHER PUBLICATIONS

Y. Zheng et al., "Evaluation of mechanical properties of Ti(Cr)Si(O)N coated cermented carbide tools", Vacuum 90 (2013), pp. 50-58.

Official Communication issued in International Bureau of WIPO Patent Application No. PCT/EP2018/052635, dated May 3, 2018, along with an English translation thereof.

* cited by examiner

ARTICLES CONSISTING OF METAL, HARD METAL, CERMET OR CERAMIC AND COATED WITH A HARD MATERIAL, AND METHOD FOR PRODUCING SUCH ARTICLES

The invention relates to articles consisting of metal, hard metal, cermet or ceramic and coated with a hard material, and to a method for producing such articles. The hard material layers according to the invention can, for example, be used as anti-wear layers for cutting tools, as protective layers for turbine blades, or as diffusion barriers in microelectronics.

Hard metal and ceramic tools currently comprise various anti-wear layers that significantly increase the service life of the tools. Due to the special properties of these tools, such as high hardness and good oxidation resistance and temperature stability, for example, the tool is protected and performance is considerably enhanced.

A plurality of hard material layers is already known from the prior art. These layers differ with regard to composition, structure, and properties.

For example, hard material layers which are composed of TiSiCN or TiSiCNO are known as anti-wear layers, wherein PVD or plasma-assisted CVD methods are used for production.

From JP 2004 074 361 A, a surface coating that is arranged on a substrate is known, wherein the surface coating is composed of a nitride, carbonitride, oxynitride or oxycarbonitride of $(M_xSi_y)$. M is Ti, Al, Cr, Zr, V, Hf Nb, Mo, W, Ta, and $0.1 \leq y \leq 0.8$, wherein $x+y=1$. The coated hard material tool exhibits a surface coating hardness that changes continuously or incrementally from the substrate surface to the surface of the coating.

From JP 2004 114 219 A, a surface coating that is arranged on a substrate is known, wherein the surface coating is made of $(Ti_xSi_y)(C_aN_bO_c)$ and has a composition of $0.1 \leq y \leq 0.8$ with $x+y=1$, $0 \leq a \leq 0.6$ and $0 \leq b \leq 1.0$ and $0 \leq c \leq 0.5$ with $a+b+c=1$. The amount of C in the surface layer increases continuously from the surface side of the substrate to the surface of the coating.

From EP 1 382 709 A1, a multi-layer coating is known in which an individual layer is formed by a TiSiCN or TiSiCNO layer which has a nanocomposite structure. This layer is composed of a cubic TiSiCN or TiSiCNO phase with a crystallite size between 0.1 nm and 10 nm, as well as an amorphous nitride, carbide, carbonitride, oxynitride or oxycarbonitride of Si. All layers are produced by means of PVD.

However, it is known that the TiSiCNO layers produced by means of a PVD method exhibit a low hardness of maximally 10 GPa (Zheng, Y., et al.: "Evaluation of mechanical properties of Ti(Cr)Si(O)N coated cemented carbide tools", Vacuum 90 (2013) 50). The cause for the low hardness in the indicated layers can be found in the fact that the high oxygen inclusion leads to the formation of crystalline Ti—O compounds and to a lower hardness, while good biocompatibility is also thereby achieved.

From WO 2008 129 528 A2, a coated metal substrate is known which comprises at least one layer of a titanium-based hard material that is alloyed with at least one alloying element from the list of chromium, vanadium and silicon. The total amount of the alloying elements is between 1% and 50% of the metal content, wherein the layer has a general formula of $(Ti_{100-a-b-c}Cr_aV_bSi_c)C_xN_yO_z$. The layer is produced by means of a CVD method. The specified CVD method is a medium-temperature process in which the alloying elements Cr, V, Si are always added in small amounts. It is also specified that the partial pressure of the silicon chloride is 0.1% to 30% of that of the metal chloride $TiCl_4$.

From DE 10 2011 087 715 A1, articles consisting of metal, hard metal, cermet or ceramic and coated with a hard material are known, which articles are coated with a TiSiCN composite layer or with a multi-layer layer system that contains at least one TiSiCN composite layer, wherein the TiSiCN composite layer contains a nanocrystalline phase of $TiC_xN_{1-x}$ and a second phase of amorphous $SiC_xN_y$, and is produced by means of a thermal CVD method without additional plasma excitation. In addition, a method is specified for producing such articles consisting of metal, hard metal, cermet or ceramic and coated with a hard material, in which method the TiSiCN composite layer is deposited on the article using a thermal CVD process at temperatures between 700° C. and 1100° C. and at pressures between 10 Pa and 101.3 kPa, without additional plasma excitation, in a gas mixture that contains one or more titanium halides, one or more silicon-containing precursors, hydrogen, and reactive compounds with carbon and nitrogen atoms, and/or nitrogen compounds, and/or hydrocarbons, and/or inert noble gases.

A disadvantage of the known solutions is that the oxygen inclusion in TiSiCN layers leads to a reduction of the hardness and oxidation resistance, and thus to an inadequate wear resistance, and that the methods for producing hard material layers are elaborate and cost intensive. Uncontrolled oxygen inclusion also takes place in the existing CVD methods.

The object of the invention is to provide hard material layers which, in addition to a high hardness and oxidation resistance, exhibit an excellent wear resistance. Included in this object is the provision of a method which enables a production of hard material layers of this type in a cost-effective manner, even under industrial conditions.

The object is attained with the features in the patent claims, wherein the invention also includes combinations of the individual dependent patent claims within the meaning of a logical AND operation, provided that they are not mutually exclusive.

According to the invention, articles consisting of metal, hard metal, cermet or ceramic and coated with a hard material are provided which are coated with a single- or multi-layer layer system by means of a thermal CVD method without plasma excitation, wherein the single- or multi-layer layer system contains at least one nanocomposite layer with an overall composition of $(Ti_xSi_y)(C_aN_bO_c)$ with $0.7 < x \leq 0.99$ and $0.01 \leq y < 0.3$ and $0.4 < a < 0.9$ and $0.1 < b < 0.6$ and $0.01 < c \leq 0.1$, wherein the nanocomposite layer comprises a first nanocrystalline phase of cubic titanium oxycarbonitride with a crystallite size of 10 nm to 100 nm and a second, amorphous phase of silicon oxycarbonitride or silicon oxycarbide, and wherein the nanocomposite layer has a chlorine content between 0.001 and 1 at %

Advantageously, multiple nanocomposite layers are arranged.

It is likewise advantageous if the articles coated with a hard material comprise the one or more nanocomposite layers, wherein the nanocomposite layer comprise a gradient with respect to the Si/Ti atomic ratio.

In an advantageous embodiment, at least one nanocomposite layer has a lamellar structure, wherein the layer having the lamellar structure advantageously comprises lamellae with a thickness between 50 nm and 500 nm. It is also advantageous if the layer having the lamellar structure comprises lamellae with different Si/Ti atomic ratios.

It is likewise advantageous if the nanocomposite layer has a hardness of 3000 HV to 4000 HV and particularly advantageously a hardness of 3300 HV to 3600 HV.

Furthermore, it is advantageous if the nanocrystalline phase has a crystallite size of 10 nm to 20 nm.

In an advantageous embodiment of the articles coated with a hard material, the nanocomposite layer has a layer thickness of 1 µm to 10 µm and particularly advantageously a layer thickness of 4 µm to 7 µm.

It is also advantageous if one or more cover layers and/or bonding layers are present, wherein the cover layers and/or bonding layers are advantageously composed of one or more nitrides, carbides, carbonitrides, oxynitrides, oxycarbides, oxycarbonitrides, oxides of Ti, Hf, Zr, Cr and/or Al or mixed phases of these elements.

According to the invention, a method is provided for producing articles consisting of metal, hard metal, cermet or ceramic and coated with a hard material, in which method at least one $(Ti_xSi_y)(C_aN_bO_c)$ nanocomposite layer is deposited by means of a thermal CVD method without plasma excitation in a gas mixture of $TiCl_4$, one or more silicon chlorides, $CH_3CN$, $H_2$, CO and/or $CO_2$ and at temperatures between 700° C. and 950° C. and at pressures between 0.1 kPa and 0.1 MPa, wherein an Si/Ti atomic ratio of greater than 1 is chosen for the silicon chloride and titanium chloride in the gas phase.

Advantageously $N_2$ is added to the gas mixture.

With the solution according to the invention, a hard material coating is provided for articles consisting of metal, hard metal, cermet or ceramic, which coating exhibits an excellent wear resistance in addition to a high hardness and oxidation resistance. The hard material coating according to the invention is produced by means of a thermal CVD method without plasma excitation, whereby a production of such articles coated with a hard material becomes possible in a cost-effective manner even under industrial conditions.

With the thermal CVD method without plasma excitation, a single- or multi-layer layer system is deposited on the articles consisting of metal, hard metal, cermet or ceramic, wherein the single- or multi-layer layer system comprises at least one nanocomposite layer having an overall composition of $(Ti_xSi_y)(C_aN_bO_c)$ with $0.7<x\leq0.99$ and $0.01\leq y<0.3$ and $0.4<a<0.9$ and $0.1<b<0.6$ and $0.01<c\leq0.1$.

The nanocomposite layer comprises a first nanocrystalline phase of cubic titanium oxycarbonitride, wherein the crystallites are present in a size of 10 nm to 100 nm. In addition, the nanocomposite layer according to the invention comprises a second, amorphous phase of silicon oxycarbonitride or silicon oxycarbide.

With the presence of two different phases in the nanocomposite layer, namely the nanocrystalline phase of cubic titanium oxycarbonitride and the second, amorphous phase of silicon oxycarbonitride or silicon oxycarbide, particularly good properties in terms of wear resistance and oxidation resistance are achieved.

While this two-phase nanocomposite structure leads to particularly high hardness values for the nanocomposite layer, a significantly improved oxidation resistance is attained through the presence of the amorphous phase of silicon oxycarbonitride or silicon oxycarbide.

In addition, because of the low chlorine content between 0.001 and 1 at. % in the nanocomposite layer, a degradation of the nanocomposite layer is avoided.

Advantageously, the articles coated with a hard material can also comprise multiple nanocomposite layers, wherein it is also possible that either only one of the individual nanocomposite layers has on its own a gradient with respect to the Si/Ti atomic ratio. However, it is also possible that the entire nanocomposite layer, which can be composed of multiple individual nanocomposite layers, has a gradient with respect to the Si/Ti atomic ratio. By incorporating a gradient with respect to the Si/Ti atomic ratio in at least one nanocomposite layer, it is achieved that the wear properties of the articles coated with a hard material are individually adapted, and that the service life of the articles coated with a hard material is thus significantly improved, for example.

Further improved mechanical properties are then achieved if at least one nanocomposite layer has a lamellar structure, wherein the lamellae have a thickness of 50 nm to 500 nm and a differing Si/Ti atomic ratio.

The advantage of lamellar structures of this type in at least one nanocomposite layer is that the propagation of cracks in the nanocomposite layer is impeded. As a result, the service life of the anti-wear layer and of the tool is significantly improved, for example.

With the nanocrystalline structure according to the invention of the hard material layer and the targeted use of CO and/or $CO_2$, particularly high hardness values of 3000 HV [0.01] to 4000 HV [0.01], in particular 3300 HV [0.01] to 3600 HV [0.01] are achieved. In addition, through the use of the special oxygen-containing precursors and the use of the thermal CVD method without plasma excitation according to the invention, it was possible to achieve in an advantageous embodiment a nanocrystalline phase of cubic titanium oxycarbonitride which has a crystallite size of 10 nm to 20 nm.

The nanocomposite layer advantageously has a layer thickness of 1 µm to 10 µm and, in a particularly advantageous embodiment, a layer thickness of 4 µm to 7 µm. As a result of the thermal CVD method without plasma excitation according to the invention, and because of the accompanying process parameters during the coating of the articles consisting of metal, hard metal, cermet or ceramic, it is possible to produce correspondingly advantageous layer thicknesses that can be individually adapted to the respective field of application and the use. In addition, through the method according to the invention it is also possible to coat complex shapes, undercuts, bore holes, and difficult-to-access regions of the articles with the nanocomposite layer according to the invention, whereby a significantly wider field of application is enabled.

It is particularly advantageous if one or more bonding layers are present between the article that is to be coated and the nanocomposite layer according to the invention, and/or if one or more cover layers are applied on the nanocomposite layer. Through the use of one or more bonding layers, a significantly better adhesion to the article consisting of metal, hard metal, cermet or ceramic by the nanocomposite layer according to the invention is in particular achieved. The application of one or more cover layers enables a further increase in the oxidation resistance or a decrease in the friction between the layer and workpiece, whereby a significantly improved service life of the anti-wear layer is achieved, for example. Advantageously, the cover layers and/or bonding layers are composed of one or more nitrides, carbides, carbonitrides, oxynitrides, oxycarbides, oxycarbonitrides, oxides of Ti, Hf Zr, Cr and/or Al or mixed phases of these elements.

According to the invention, the TiSiCNO nanocomposite layers are provided on articles consisting of metal, hard metal, cermet or ceramic which, as a result, exhibit particularly advantageous properties. This is achieved with the thermal CVD method without plasma excitation according to the invention, in which method at least one $(Ti_xSi_y)$ ($C_aN_bO_c$) nanocomposite layer is deposited in a gas mixture of $TiCl_4$, one or more silicon chlorides, $CH_3CN$, $H_2$, CO, and/or $CO_2$ and at temperatures between 700° C. and 950° C. and at pressures between 0.1 kPa and 0.1 MPa, wherein an Si/Ti atomic ratio of greater than 1 is chosen for the silicon chloride and titanium chloride in the gas phase.

Unlike known TiSiCN nanocomposite layers, a reduction in the grain size of the cubic titanium carbonitride phase with a simultaneous conversion into titanium oxycarbonitride is achieved through the targeted inclusion of oxygen with the use of a gas admixture of CO and/or $CO_2$.

Surprisingly, it was possible to determine that, for example, through the specific selection of the oxygen-containing precursors CO and/or $CO_2$ in combination with the special process conditions, a targeted inclusion of oxygen in the second, amorphous phase is achieved, and that the structure of the nanocomposite layer is in this manner significantly influenced. It is thus achieved that the crystallite size of the nanocrystalline phase is significantly reduced even at a low Si content, which leads to a particularly fine structure and considerably improved mechanical properties of the anti-wear layer.

This is shown by way of example by the results presented in the table for coatings carried out by means of a CVD method, and by experiments.

| Deposition temperature (° C.) | Pressure (kPa) | $SiCl_4/TiCl_4$ ratio | CO admixture | Hardness HV [0.01] | Crystallite size (nm) |
| --- | --- | --- | --- | --- | --- |
| 850 | 6 | 2.45 | None | 3670 | 28 |
| 850 | 6 | 2.45 | 0.3 vol. % | 3970 | 18 |

Because it is not possible to predict how the inclusion of O in the multi-phase nanocomposite layer will take place where the oxygen-containing precursors CO and/or $CO_2$ are used in CVD processes with such complex gas mixtures, spectroscopic analyses were performed to determine the bonding characteristics.

It was possible to identify the formation of Ti—O and Si—O bonds through an analysis of the O1s and Si2p spectra by means of XPS spectroscopy. Surprisingly, with the ($Ti_xSi_y$)($C_aN_bO_c$) nanocomposite layer according to the invention, it was shown that extremely high hardnesses up to 4000 HV [0.01] are achieved by means of a Vickers indenter with a defined oxygen inclusion, provided that an oxygen threshold of $c=0.1$ in the nanocomposite layer is not exceeded.

Surprisingly, it was found that, where the oxygen-containing precursors CO and/or $CO_2$ are used, lamellar structures occur if an $SiCl_4/TiCl_4$ ratio is set between 4 and 7.

Figure 2:
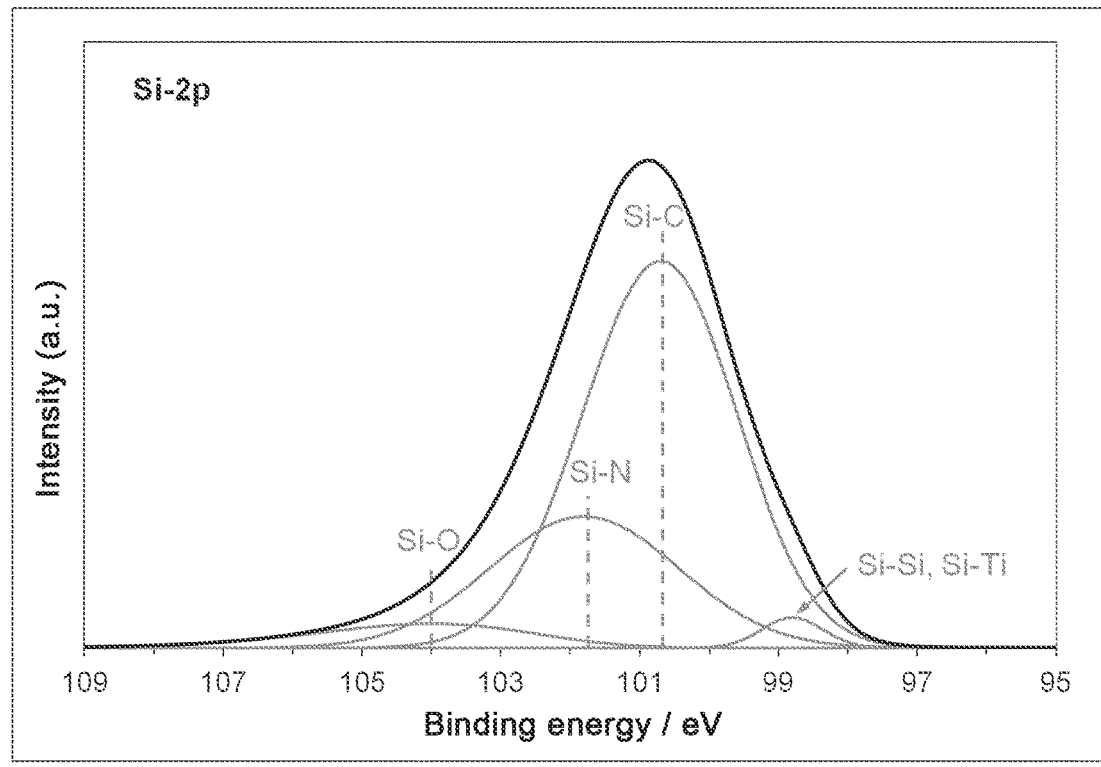
Figure 3:
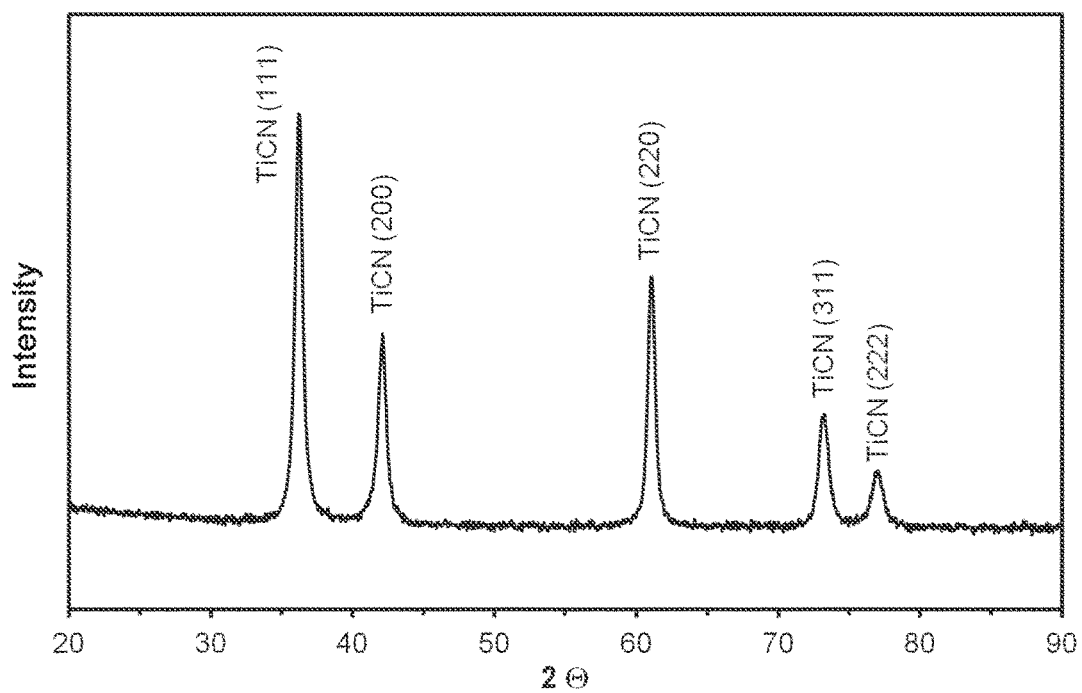
Figure 4:
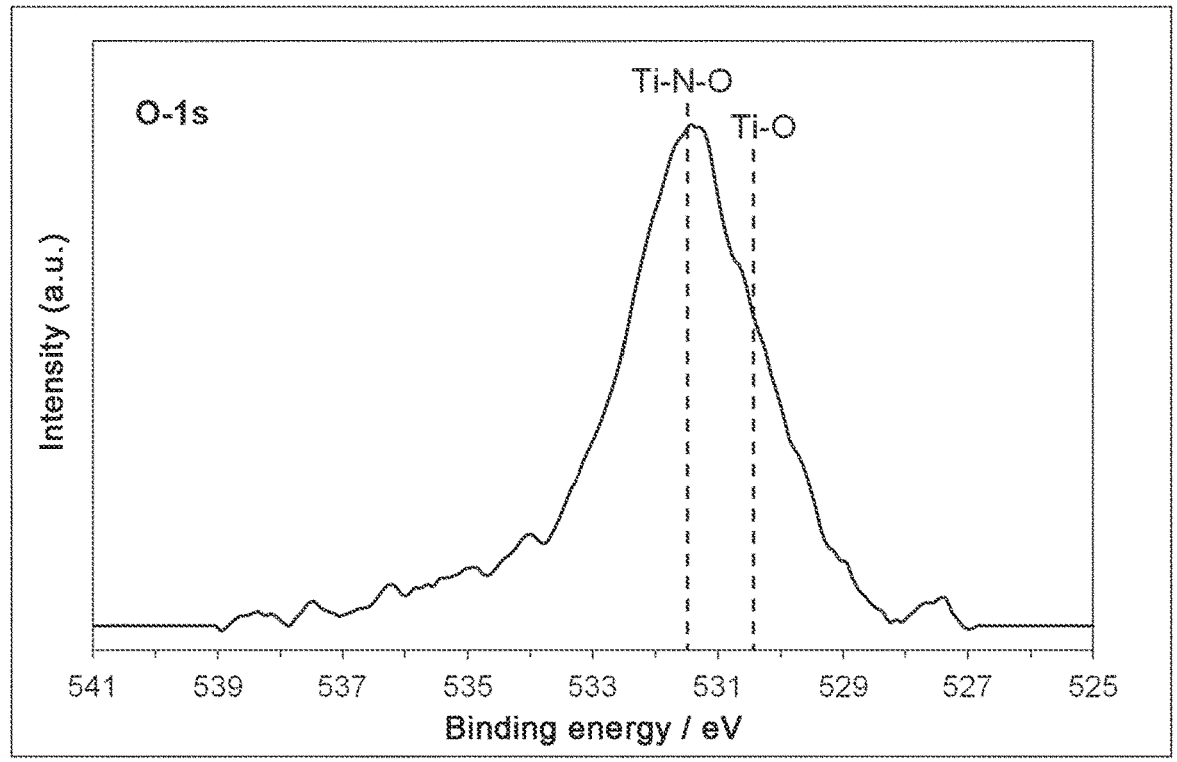
Figure 5:
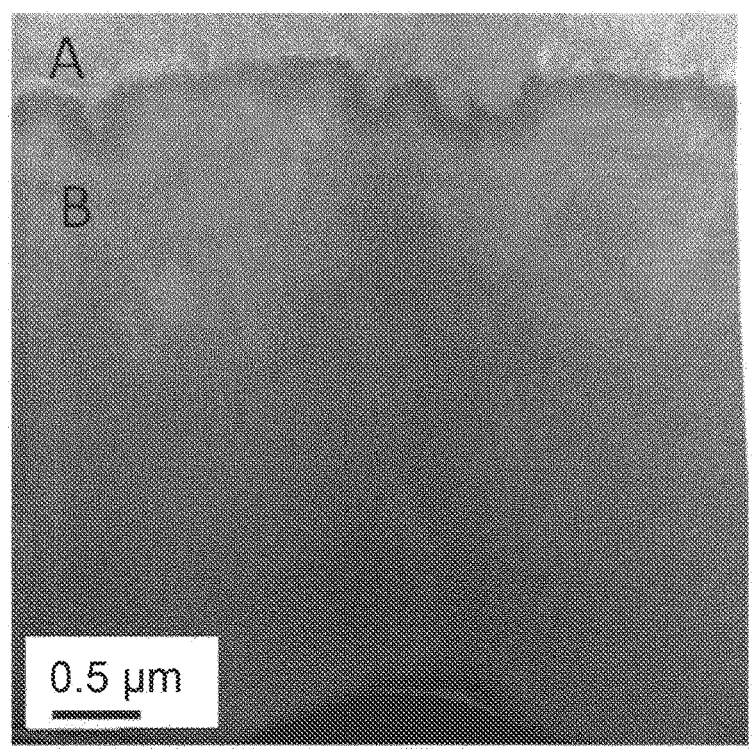
Figure 6:
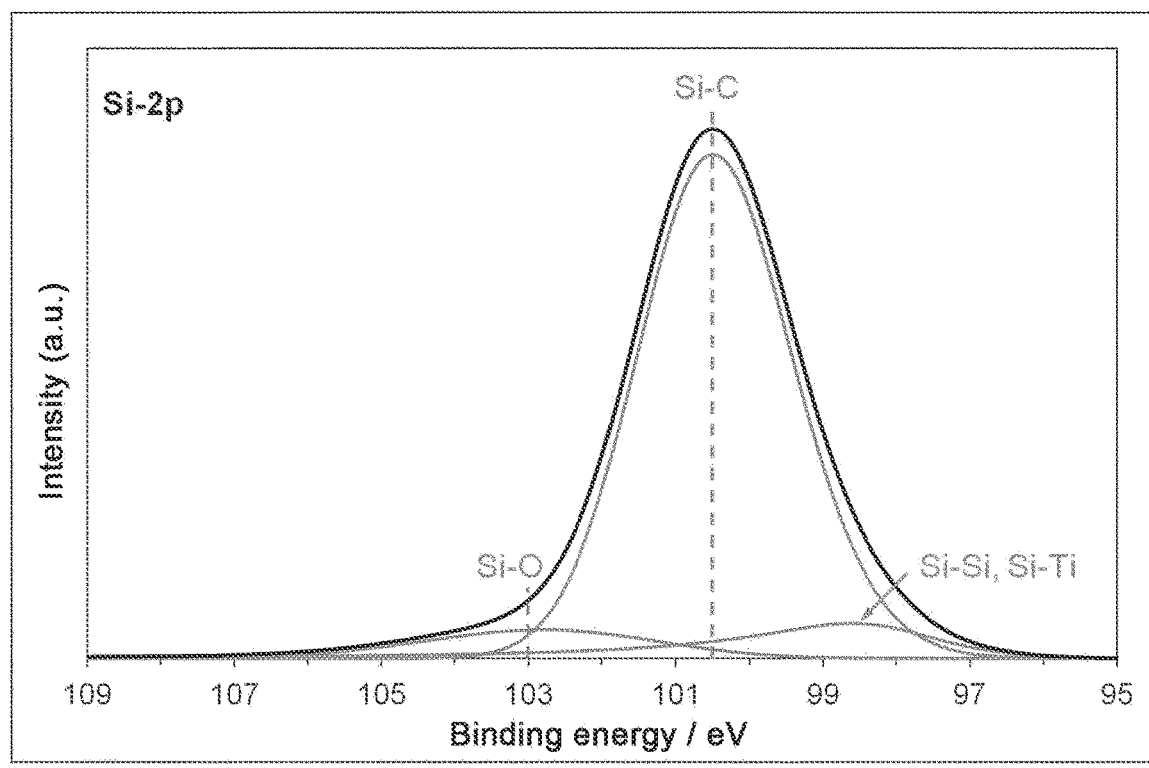

The invention is explained below in greater detail with the aid of exemplary embodiments and figures. The figures show:

FIG. 1: An X-ray diffractogram of the ($Ti_xSi_y$)($C_aN_bO_c$) nanocomposite layer according to Exemplary Embodiment 1 produced by means of a CVD method without plasma excitation;

FIG. 2: An XPS spectrum with a resolved Si2p peak for the ($Ti_xSi_y$)($C_aN_bO_c$) nanocomposite layer in Exemplary Embodiment 1;

FIG. 3: An X-ray diffractogram of the ($Ti_xSi_y$)($C_aN_bO_c$) nanocomposite layer according to Exemplary Embodiment 2 produced by means of a CVD method;

FIG. 4: An XPS spectrum with an O1s peak for the ($Ti_xSi_y$)($C_aN_bO_c$) nanocomposite layer in Exemplary Embodiment 2;

FIG. 5: A TEM micrograph of the ($Ti_xSi_y$)($C_aN_bO_c$) nanocomposite layer (B) with a lamellar structure and the TiN layer (A) positioned thereunder according to Exemplary Embodiment 3;

FIG. 6: An XPS spectrum with a resolved Si2p peak for the ($Ti_xSi_y$)($C_aN_bO_c$) nanocomposite layer in Exemplary Embodiment 4;

EXEMPLARY EMBODIMENT 1

A high-silicon ($Ti_xSi_y$)($C_aN_bO_c$) nanocomposite layer is deposited as a cover layer by means of a thermal CVD method on WC/Co indexable hard metal inserts that are pre-coated with a 5-μm thick TiN/TiCN/TiN layer system. The coating process is carried out in a hot wall CVD reactor with an inner diameter of 75 mm. The CVD coating takes place with a gas mixture of 0.09 vol. % $TiCl_4$, 0.58 vol. % $SiCl_4$, 0.23 vol. % $CH_3CN$, 0.31 vol. % CO and 98.79 vol. % $H_2$. The deposition temperature is 850° C. and the process pressure is 6 kPa. After a coating time of 90 min, a 4.5-μm thick ($Ti_xSi_y$)($C_aN_bO_c$) layer is obtained.

From the X-ray diffractogram in FIG. 1, it is evident that only a cubic $TiC_1N_{1-x}$ phase is identified in the X-ray thin layer analysis conducted with grazing incidence. XPS analyses found that the cubic $TiC_cN_{1-x}$ phase is composed of titanium oxycarbonitride. The O1s spectrum has a broad peak between 529 and 533 eV, which can be attributed both to Ti—O and also Si—O bonds. As an additional phase, the nanocomposite layer contains amorphous silicon oxycarbonitride, which was identified by the XPS analysis shown in FIG. 2.

By means of Rietveld analysis, a crystallite size of 18.3±1.8 nm was determined for the nanocrystalline titanium oxycarbonitride phase.

The elemental analysis by means of WDX found the following element content:
39.5 at. % Ti,
9.7 at. % Si,
27.2 at. % C,
21.0 at. % N,
2.1 at. % O,
and 0.5 at. % Cl.

For this ($Ti_xSi_y$)($C_aN_bO_c$) nanocomposite layer, there results a y value of 0.2, which is calculated from the concentrations in at. % in accordance with y=Si/(Si+Ti). From the WDX elemental analysis, there results an overall composition for C, N, O with a=0.54, b=0.42 and c=0.04. By means of a Vickers indenter, a microhardness of 3590 HV [0.01] was measured.

Exemplary Embodiment 2

A low-silicon ($Ti_xSi_y$)($C_aN_bO_c$) nanocomposite layer is deposited as a cover layer by means of a thermal CVD method on WC/Co indexable hard metal inserts that are pre-coated with a 5-μm thick TiN/TiCN/TiN layer system. The coating process is carried out in a hot wall CVD reactor with an inner diameter of 75 mm. The CVD coating takes place with a gas mixture of 0.18 vol. % $TiCl_4$, 0.57 vol. % $SiCl_4$, 0.22 vol. % $CH_3CN$, 0.78 vol. % CO, 71.38 vol. % $H_2$, and 26.87 vol. % $N_2$. The deposition temperature is 850° C. and the process pressure is 6 kPa. After a coating time of 90 min, a 6.9-μm thick ($Ti_xSi_y$)($C_aN_bO_c$) layer is obtained.

In the X-ray thin layer analysis conducted with grazing incidence, only a cubic $TiC_xN_{1-x}$ phase is identified, as the X-ray diffractogram presented in FIG. 3 shows. XPS analyses found that the cubic $TiC_xN_{1-x}$ phase is composed of titanium oxycarbonitride. According to FIG. 4, the O1s spectrum has a broad peak between 529 and 533 eV, which can mainly be attributed to Ti—O bonds due to the low silicon content of the layer, but also to Ti—N—O and/or Ti—C—O bonds.

As an additional phase, the nanocomposite layer contains amorphous silicon oxycarbonitride, which was also identified by means of XPS analysis. By means of Rietveld analysis, a crystallite size of 16.8±2.1 nm was determined for the nanocrystalline titanium oxycarbonitride phase.

The elemental analysis by means of WDX found the following element content:
43.2 at. % Ti,
1.7 at. % Si,
26.0 at. % C,
25.4 at. % N,
3.4 at. % O, and
0.3 at. % Cl.

For this $(Ti_xSi_y)(C_aN_bO_c)$ nanocomposite layer, there results a y value of 0.04, which is calculated from the concentrations in at. % in accordance with y=Si/(Si+Ti). From the WDX elemental analysis, there results an overall composition for C, N, O with a=0.47, for b=0.46 and for c=0.06. By means of a Vickers indenter, a microhardness of 3330 HV [0.01] was measured.

Exemplary Embodiment 3

A $(Ti_xSi_y)(C_aN_bO_c)$ nanocomposite layer is deposited as a cover layer by means of the thermal CVD method according to the invention on WC/Co indexable hard metal inserts that are pre-coated with a 5-μm thick TiN/TiCN/TiN layer system. The coating process is carried out in a hot wall CVD reactor with an inner diameter of 75 mm. The CVD coating takes place with a gas mixture of 0.09 vol. % $TiCl_4$, 0.58 vol. % $SiCl_4$, 0.22 vol. % $CH_3CN$, 0.31 vol. % CO, 71.5 vol. % $H_2$, and 27.3 vol. % $N_2$. The deposition temperature is 850° C. and the process pressure is 6 kPa.

After a coating time of 90 min, a 4.1-μm thick $(Ti_xSi_y)(C_aN_bO_c)$ nanocomposite layer is obtained.

FIG. 5 shows a TEM micrograph of a cross-section of a $(Ti_xSi_y)(C_aN_bO_c)$ nanocomposite layer that has a lamellar structure which is produced with an $SiCl_4/TiCl_4$ ratio set between 4 and 7. Different Si/Ti atomic ratios are present in the lamellae, which ratios can be identified by an EDX line scan. In the X-ray thin layer analysis conducted with grazing incidence, only a cubic $TiC_xN_{1-x}$ phase is identified. Silicon is contained in a second, amorphous silicon oxycarbonitride phase. By means of Rietveld analysis, a crystallite size of 17.0±2.7 nm was determined for the nanocrystalline titanium oxycarbonitride phase.

The elemental analysis by means of WDX found the following element content:
42.1 at. % Ti,
4.7 at. % Si,
26.7 at. % C,
23.7 at. % N,
2.7 at. % O, and
0.1 at. % Cl.

For this $(Ti_xSi_y)(C_aN_bO_c)$ nanocomposite layer, there results a y value of 0.1, which is calculated from the concentrations in at % in accordance with y=Si/(Si+Ti). From the WDX elemental analysis, there results an overall composition for C, N, O with a=0.50, for b=0.45 and for c=0.05. By means of a Vickers indenter, a microhardness of 3410 HV [0.01] was measured.

Exemplary Embodiment 4

A $(Ti_xSi_y)(C_aN_bO_c)$ nanocomposite layer is deposited as a cover layer by means of a thermal CVD method on WC/Co indexable hard metal inserts that are pre-coated with a 5-μm thick TiN/TiCN/TiN layer system. The coating process is carried out in a hot wall CVD reactor with an inner diameter of 75 mm. The CVD coating takes place with a gas mixture of 0.12 vol. % $TiCl_4$, 0.58 vol. % $SiCl_4$, 0.22 vol. % $CH_3CN$, 0.59 vol. % CO, 71.36 vol. % $H_2$, and 27.13 vol. % $N_2$. The deposition temperature is 850° C. and the process pressure is 6 kPa. After a coating time of 90 min, a 4.4-μm thick $(Ti_xSi_y)(C_aN_bO_c)$ layer is obtained.

In the X-ray thin layer analysis conducted with grazing incidence, only a cubic $TiC_xN_{1-x}$ phase is identified. XPS analyses found that the cubic $TiC_xN_{1-x}$ phase is composed of titanium oxycarbonitride. As an additional phase, the nanocomposite layer contains amorphous silicon oxycarbide that was identified by the XPS analysis shown in FIG. 6. By means of Rietveld analysis, a crystallite size of 14.0±2.1 nm was determined for the nanocrystalline titanium oxycarbonitride phase.

The elemental analysis by means of WDX found the following element content:
42.5 at. % Ti,
2.7 at. % Si,
25.5 at. % C,
26.2 at. % N,
2.9 at. % O, and
0.2 at. % Cl.

For this $(Ti_xSi_y)(C_aN_bO_c)$ nanocomposite layer, there results a y value of 0.06, which is calculated from the concentrations in at % in accordance with y=Si/(Si+Ti). From the WDX elemental analysis, there results an overall composition for C, N, O with a=0.47, for b=0.48 and for c=0.05. By means of a Vickers indenter, a microhardness of 3410 HV [0.01] was measured.

The invention claimed is:

1. Articles consisting of metal, hard metal, cermet or ceramic and coated with a hard material, Which articles are coated with a single- or multi-layer layer system by means of a thermal CVD method without plasma excitation,
    wherein the single- or multi-layer layer system contains at least one nanocomposite layer with an overall composition of $(Ti_xSi_y)(C_aN_bO_c)$ with $0.7<x\leq0.99$ and $0.01\leq y<0.3$ and $0.4<a<0.9$ and $0.1<b<0.6$ and $0.01<c\leq0.1$, with x+y=1 and a+b+c=1,
    wherein the nanocomposite layer comprises a first nanocrystalline phase of cubic titanium oxycarbonitride with a crystallite size of 10 nm to 20 nm and a second, amorphous phase of silicon oxycarbonitride or silicon oxycarbide, wherein Ti—O bonds and Si—O bonds are formed; and
    wherein the nanocomposite layer has a chlorine content between 0.001 and 1 at. %.

2. The articles coated with a hard material according to claim 1 in which multiple nanocomposite layers are arranged.

3. The articles coated with a hard material according to claim 1 in which the one or more nanocomposite layers have a gradient with respect to the Si/Ti atomic ratio.

4. The articles coated with a hard material according to claim 1 in which at least one nanocomposite layer has a lamellar structure.

5. The articles coated with a hard material according to claim 4 in which the layer having the lamellar structure comprises lamellae with a thickness between 50 nm and 500 nm.

6. The articles coated with a hard material according to claim 4 in which the layer having the lamellar structure comprises lamellae with different Si/Ti atomic ratios.

7. The articles coated with a hard material according to claim 1 in whiCh the nanocomposite layer has a hardness of 3000 HV to 4000 HV.

8. The articles coated with a hard material according to claim 1 in which the nanocomposite layer has a layer thickness of 1 μm to 10 μm.

9. The articles coated with a hard material according to claim 1 in which one or more cover layers and/or bonding layers are present.

10. The articles coated with a hard material according, to claim 9 in which the cover layers and/or bonding layers are composed of one or more nitrides, carbides, carbonitrides, oxynitrides, oxycarbides, oxycarbonitrides, oxides of Ti, Hf, Zr, Cr and/or Al or mixed phases of these elements.

11. The articles coated with a hard material according to claim 1 in which the nanocomposite layer has a hardness of 3300 HV to 3600 HV.

12. The articles coated with a hard material according to claim 1 in which the nanocomposite layer has a layer thickness of 4 μm to 7 μm.

13. A method for producing articles consisting of metal, hard metal, cermet or ceramic and coated with a hard material, according to claim 1, said method comprising:
    depositing at least one $(Ti_xSi_y)(C_aN_bO_c)$ nanocomposite layer by a thermal CVD method without plasma excitation in a gas mixture of $TiCl_4$ one or more silicon chlorides, $CH_3CN$, $H_2$, using a gas admixture from CO or $CO_2$ and at temperatures between 700° C. and 950° C. and at pressures between 0.1 kPa and 0.1 MPa,
    wherein an Si/Ti atomic ratio of greater than 1 is chosen for the silicon chloride and titanium chloride in the gas phase.

14. The method according to claim 13 further comprising: adding in which $N_2$ is added to the gas mixture.

15. Articles consisting of metal, hard metal, cermet or ceramic and coated with a hard material, which articles are coated with a single- or multi-layer layer system by means of a thermal CVD method without plasma excitation from a gas mixture of $TiCl_4$ one or more silicon chlorides, $CH_3CN$, $H_2$, using a gas admixture from CO or $CO_2$ and at temperatures between 700° C. and 950° C. and at pressures between 0.1 kPa and 0.1 MPa,
    wherein the single- or multi-layer layer system contains at least one nanocomposite layer with an overall composition of $(Ti_xSi_y)(C_aN_bO_c)$ with $0.7<x\leq0.99$ and $0.01\leq y<0.3$ and $0.4<a<0.9$ and $0.1<b<0.6$ and $0.01<c\leq0.1$, with $x+y=1$ and $a+b+c=1$,
    wherein the at least one nanocomposite layer has a lamellar structure with different Si/Ti atomic ratios,
    wherein the nanocomposite layer comprises a first nanocrystalline phase of cubic titanium oxycarbonitride with a crystallite size of 10 nm to 20 nm and a second, amorphous phase of silicon oxycarbonitride or silicon oxycarbide, wherein Ti—O bonds and Si—O bonds are formed; and
    wherein the nanocomposite layer has a chlorine content between 0.001 and 1 at. %.

* * * * *